(12) United States Patent
Deal et al.

(10) Patent No.: US 11,943,892 B2
(45) Date of Patent: Mar. 26, 2024

(54) ELECTRONICS SHELVING ASSEMBLY AND METHOD

(71) Applicant: Transportation IP Holdings, LLC, Norwalk, CT (US)

(72) Inventors: Scott Deal, Erie, PA (US); Christopher Mason, Duncan, SC (US)

(73) Assignee: Transportation IP Holdings, LLC, Norwalk, CT (US)

( * ) Notice: Subject to any disclaimer, the term of this patent is extended or adjusted under 35 U.S.C. 154(b) by 80 days.

(21) Appl. No.: 17/882,729

(22) Filed: Aug. 8, 2022

(65) Prior Publication Data

US 2023/0337389 A1 Oct. 19, 2023

Related U.S. Application Data

(60) Provisional application No. 63/331,913, filed on Apr. 18, 2022.

(51) Int. Cl.
*H05K 7/18* (2006.01)
*H05K 7/14* (2006.01)

(52) U.S. Cl.
CPC .......... *H05K 7/183* (2013.01); *H05K 7/1407* (2013.01)

(58) Field of Classification Search
CPC .... H05K 7/1489; H05K 7/183; H05K 7/1407; H05K 5/0204; H05K 7/14; F16M 13/02; F16M 2200/028; H01R 4/56; H01R 4/58; H01R 4/60; H01R 13/193; H01H 9/20
See application file for complete search history.

(56) References Cited

U.S. PATENT DOCUMENTS

| | | | | |
|---|---|---|---|---|
| 3,977,749 A * | 8/1976 | Langenbach | ........ | H01R 13/193 439/372 |
| 4,236,190 A * | 11/1980 | Hollingsead | ......... | H05K 7/1454 439/744 |
| 4,766,517 A * | 8/1988 | Abell | .................. | H05K 7/1412 361/825 |
| 5,066,832 A * | 11/1991 | Clarey | .................. | H02B 1/305 220/4.03 |
| 6,170,784 B1 * | 1/2001 | MacDonald | ......... | H05K 7/1448 248/65 |
| 6,665,189 B1 * | 12/2003 | Lebo | .................... | H05K 7/1412 361/728 |

(Continued)

*Primary Examiner* — Ko H Chan
(74) *Attorney, Agent, or Firm* — Mary D. Lawlor; The Small Patent Law Group

(57) ABSTRACT

An electronics shelving assembly and a method of assembling includes an electronics shelving assembly includes vertical support members that can be coupled with a wall of a vehicle. The vertical support members are conductively coupled with an electrical ground. The electronics shelving assembly also includes shelves, each having a horizontal support member and at least one vertical coupling member coupled with each other. Fastener assemblies mechanically and conductively couple the shelves with the vertical support members. Each of the fastener assemblies includes plural conductive plates sandwiched together and extending around a conductive fastener. The conductive fasteners may be coupled with each of the conductive plates and may be secured to the shelves to create a conductive pathway between the shelves and the electrical ground via the conductive plates and at least one of the vertical support members.

20 Claims, 11 Drawing Sheets

(56) References Cited

U.S. PATENT DOCUMENTS

| | | | | |
|---|---|---|---|---|
| 7,404,736 | B2* | 7/2008 | Herbst | H04Q 1/13 |
| | | | | 439/557 |
| 10,001,402 | B1* | 6/2018 | Gyori | G01G 21/28 |
| 10,121,121 | B1* | 11/2018 | De Bonet | A47B 57/34 |
| 10,312,700 | B2* | 6/2019 | Roberts | H05K 7/14 |
| 10,466,095 | B1* | 11/2019 | O'Neill | G01G 19/42 |
| 10,809,122 | B1* | 10/2020 | Danenberg | A47F 5/103 |
| 2014/0201042 | A1* | 7/2014 | Meyer | G06Q 10/087 |
| | | | | 705/28 |
| 2018/0151966 | A1* | 5/2018 | Holma | H01R 4/64 |
| 2019/0052186 | A1* | 2/2019 | Hayashi | H02M 7/48 |

* cited by examiner

ELECTRONICS SHELVING ASSEMBLY AND METHOD

CROSS-REFERENCE TO RELATED APPLICATIONS

This application claims priority to U.S. Provisional Application No. 63/331,913 (filed 18 Apr. 2022), the entire disclosure of which is incorporated herein by reference.

BACKGROUND

Technical Field

The subject matter described herein relates to shelving assemblies for electronics.

Discussion of Art

Power systems include electronic devices and components that may be associated with the control and/or operation of the power systems. For example, the devices may be processing units, communication devices, control units, energy storage devices, or the like. In some embodiments, the electronic devices may be stored onboard or within the power systems, such as onboard a vehicle system. The electronic devices may be stored within a predetermined area or region of the power system, such as within lockers and/or on a shelving systems designated for the electronic devices. The shelving systems may be disposed within secure areas of the power system, such as within a locked region of a vehicle system, where access to the controlling components is restricted.

The electronic devices may generate thermal energy that, when combined with the thermal energy generated by other electronic devices, may require thermal management control of the shelving system to ensure adequate ventilation of the electronic devices. For example, without adequate ventilation, the electronic devices may be at risk of failure. Additionally, the electronic devices may carry an amount of power through the devices, and the user of the devices may be required to provide a proper conductive grounding path for the safety of the electronic devices and the power system in which the devices are used.

A need exists for an electronics shelving assembly which is different than existing systems and methods.

BRIEF DESCRIPTION

In one aspect or example, an electronics shelving assembly includes vertical support members that can be coupled with a wall of a vehicle. The vertical support members are conductively coupled with an electrical ground. The electronics shelving assembly also includes shelves, each having a horizontal support member and at least one vertical coupling member each coupled with the horizontal support member. Fastener assemblies mechanically and conductively couple the shelves with the vertical support members. Each of the fastener assemblies includes plural conductive plates sandwiched together and extending around a conductive fastener. The conductive fasteners may be coupled with each of the conductive plates and may be secured to the shelves to create a conductive pathway between the shelves and the electrical ground via the conductive plates and at least one of the vertical support members.

In one aspect of example, an electronics shelving assembly may include vertical support members that may be coupled with a wall of a vehicle. The vertical support members may be conductively coupled with an electrical ground. The electronics shelving assembly can include shelves, each having a horizontal support member and first and second vertical coupling members coupled with the horizontal support member. The first and second vertical coupling members can frame respective air flow openings for air to flow between the first and second vertical coupling members. Fastener assemblies may mechanically and conductively couple the shelves with the vertical support members.

In one aspect or example, an electronics shelving assembly may include support members that may be coupled with a wall of a vehicle. The support members may be conductively coupled with an electrical ground. The electronics shelving assembly can include shelf units, each having a shelf member and first and second coupling members coupled with the shelf member. Fastener assemblies may mechanically couple the first and second coupling members of the shelf units with the support members. Each of the fastener assemblies may include a respective conductive fastener that can be secured to the support members to create a conductive pathway between the shelf units and the electrical ground via the support members.

BRIEF DESCRIPTION OF THE DRAWINGS

The inventive subject matter may be understood from reading the following description of non-limiting embodiments, with reference to the attached drawings, wherein below.

DETAILED DESCRIPTION

Embodiments of the subject matter described herein relate to an electronics shelving assembly and method of assembly. The electronics shelving assembly may be used within a power system, such as a power generating system (e.g., a vehicle, a stationary power generating system, or the like) to control thermal conditions of electronic devices positioned on shelves of the electronics shelving assembly. Additionally, the assembly may be used to conductively couple the electronic devices with an electrical ground of the power system in which the electronics shelving assembly is disposed or is associated therewith.

In one or more embodiments, the shelving assembly may include one or more vertical support members that may be coupled with a wall of the power system. The power system may be a vehicle or non-vehicular power system. The vertical support members may be conductively coupled with an electrical ground of the power system. In one embodiment, the wall of the power system may be an electrical ground of the power system. In another embodiment, the wall maybe conductively coupled with a separate electrical ground of the power system, such as a ground block or ground plane.

The shelving assembly includes one or more shelves or shelf units, each having a horizontal support member. The electronic devices may be positioned on the horizontal support member. The shelves may include at least one vertical coupling members conductively and/or mechanically coupled with the horizontal support member. In one embodiment, one or more fastener assemblies may mechanically and conductively couple the shelves with at least one of the vertical support members. Each fastener assembly may include plural conductive plates that are sandwiched together and extend around a conductive fastener, such as a screw or bolt. The conductive fastener of each fastener assembly may be coupled with each of the plural conductive plates and secured to at least one of the vertical support members. For example, the conductive fastener may create a conductive pathway between each of the shelves and the electrical ground via the conductive plates and the at least one vertical support members.

Figure 1:
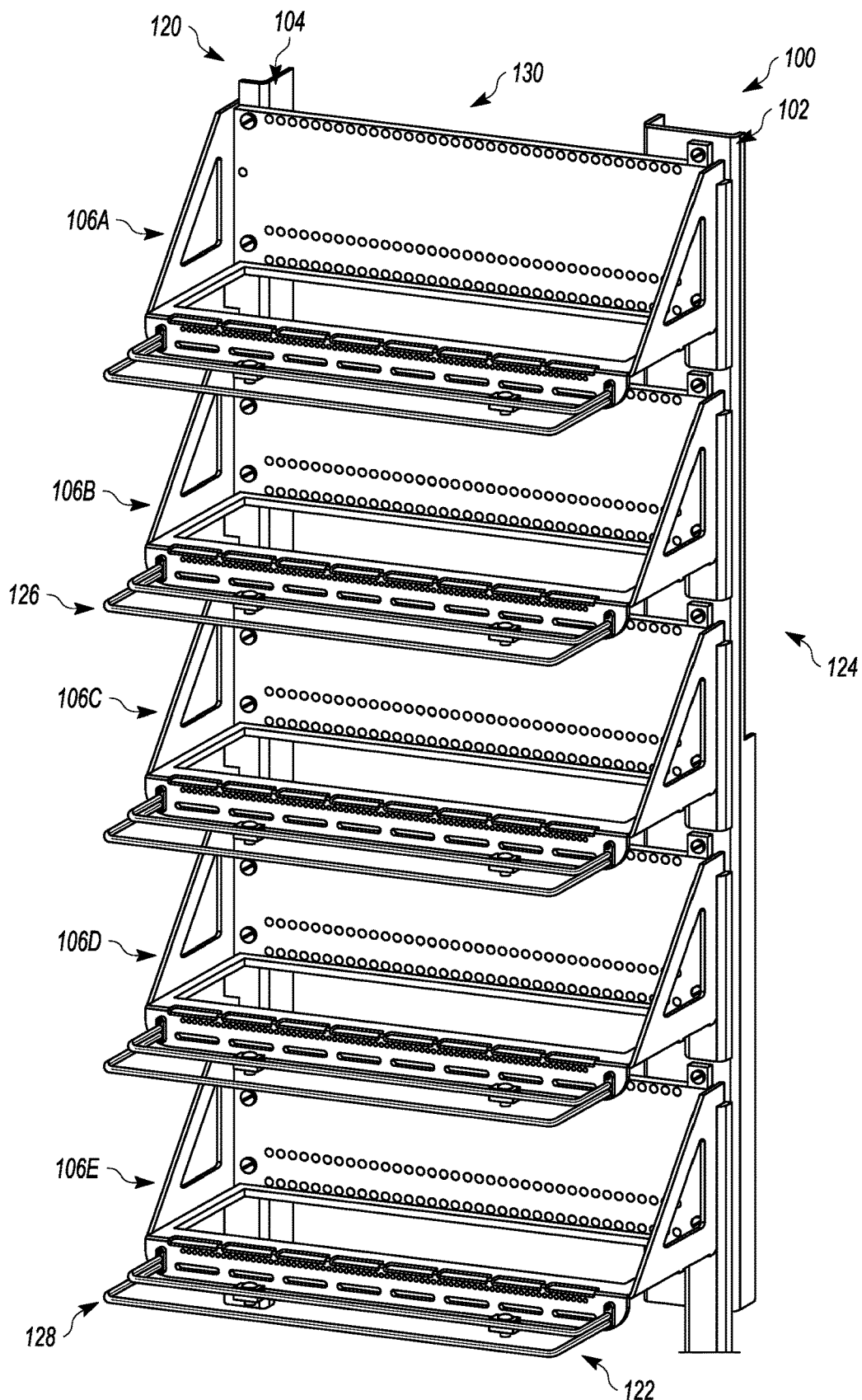
FIG. 1 illustrates a perspective view of an electronics shelving assembly in accordance with one embodiment.

FIG. 1 illustrates one example of an electronics shelving assembly 100 in accordance with one embodiment. The electronics shelving assembly may be used to hold one or more electronic devices or components such as, but not limited to, processing units, communication systems or devices, controller systems, or the like. In one embodiment, the electronics shelving assembly may be disposed onboard a vehicle system, and electronic devices or components of the vehicle system may be disposed on shelves of the shelving assembly. The vehicle system may be a rail vehicle, an automobile, a truck (with or without a trailer), a bus, a marine vessel, an aircraft, a mining vehicle, an agricultural vehicle, or other off-highway vehicle. Optionally, the electronics shelving assembly may be used within or associated with a stationary and/or other non-vehicle power system. The vehicle systems described herein (rail vehicle systems or other vehicle systems that do not travel on rails or tracks) can be formed from a single vehicle or multiple vehicles, and optionally the operating system may extend between two or more of the multiple vehicles. With respect to multi-vehicle systems, the vehicles can be mechanically coupled with each other (e.g., by couplers) or logically coupled but not mechanically coupled. For example, vehicles may be logically but not mechanically coupled when the separate vehicles communicate with each other to coordinate movements of the vehicles with each other so that the vehicles travel together as a group. Vehicle groups may be referred to as a convoy, consist, swarm, fleet, platoon, and train.

In one embodiment, the electronics shelving assembly may be retrofitted within an existing vehicle system. For example, the electronics shelving assembly may be positioned within an existing vehicle system, such as to replace an existing electronics shelving assembly, or to provide an electronics shelving assembly in an existing vehicle that was void a shelving assembly. In another embodiment, the electronics shelving assembly may be designed to be disposed within a new vehicle. For example, the electronics shelving assembly may be considered into the design of the new vehicle, such as by placing consideration on the shape and/or size of the electronic devices of the new vehicle, a new space in which the assembly may be placed, electrical and/or mechanical requirements of the new vehicle design, or the like.

The electronics shelving assembly includes first and second vertical support members 102, 104. The vertical support members are laterally spaced apart from each other and extend in a substantially vertical direction between a top end 120 and a bottom end 122 of the assembly. The electronics shelving assembly extends between the top end and the bottom end, a first side 124 and an opposite second side 126, a front end 128, and an opposite rear end 130. In the illustrated embodiment, the electronics shelving assembly includes first and second vertical support members, but optionally may include any number of vertical support members. The first and second vertical support members may have substantially the same shape and/or size, or alternatively one of the support members may have a shape and/or size that is unique relative to a shape and/or size of the other support member. For example, the shape, size, and spacing between the vertical support members may be based on a space or size of the vehicle system within which the electronics shelving assembly may be disposed, one or more needs or requirements by a user of the electronics shelving assembly, or the like.

In one or more embodiments, the vertical support members may be operably coupled with a wall of the vehicle system. As one example, the vertical support members may be welded, fastened, or otherwise coupled with the wall. For example, the vertical support members may be manufactured of a metal or metal alloy, and may be coupled with the wall of the vehicle system such that the vertical supports may be conductively coupled with the wall of the vehicle system. In one embodiment, the wall of the vehicle system may be a ground block of the vehicle system. In another embodiment, the wall may be electrically and conductively coupled with an alternative ground block of the vehicle system. For example, the vertical support members may be conductively coupled with and electrically grounded with a ground block of the vehicle system. Optionally, the vertical support members may be operably coupled with a surface, sheet, or the like, and the surface, the sheet, or the like, may be electrically and mechanically coupled with the wall of the vehicle.

The electronics shelving assembly also includes plural shelves 106A-E that are operably coupled with the vertical support members. In the illustrated embodiment, the electronics shelving assembly includes five shelves or shelf assemblies, but optionally may include more than five or less than five shelves. The shelves are disposed such that the shelves are stacked on each other in a substantially vertical direction, with substantially uniform spacing between each and neighboring shelves above and below. Optionally, one or more of the shelves may be removed from the assembly and/or the shelves may be spaced apart by uniform and/or unique spacing distances. For example, the number of shelves and/or the placement of the shelves may be based on requirements of an end use of the electronics shelving assembly, different types and/or sizes of electronic devices that may be stored within the assembly, a space or size of the vehicle system within which the electronics shelving assembly may be disposed, a weight distribution requirement of the vehicle system in which the electronics shelving assembly may be used, or any combination therein. For example, the number of shelves and the placement of the shelves may be customized based on one or more needs or requirements by a user of the electronics shelving assembly.

Figure 2:
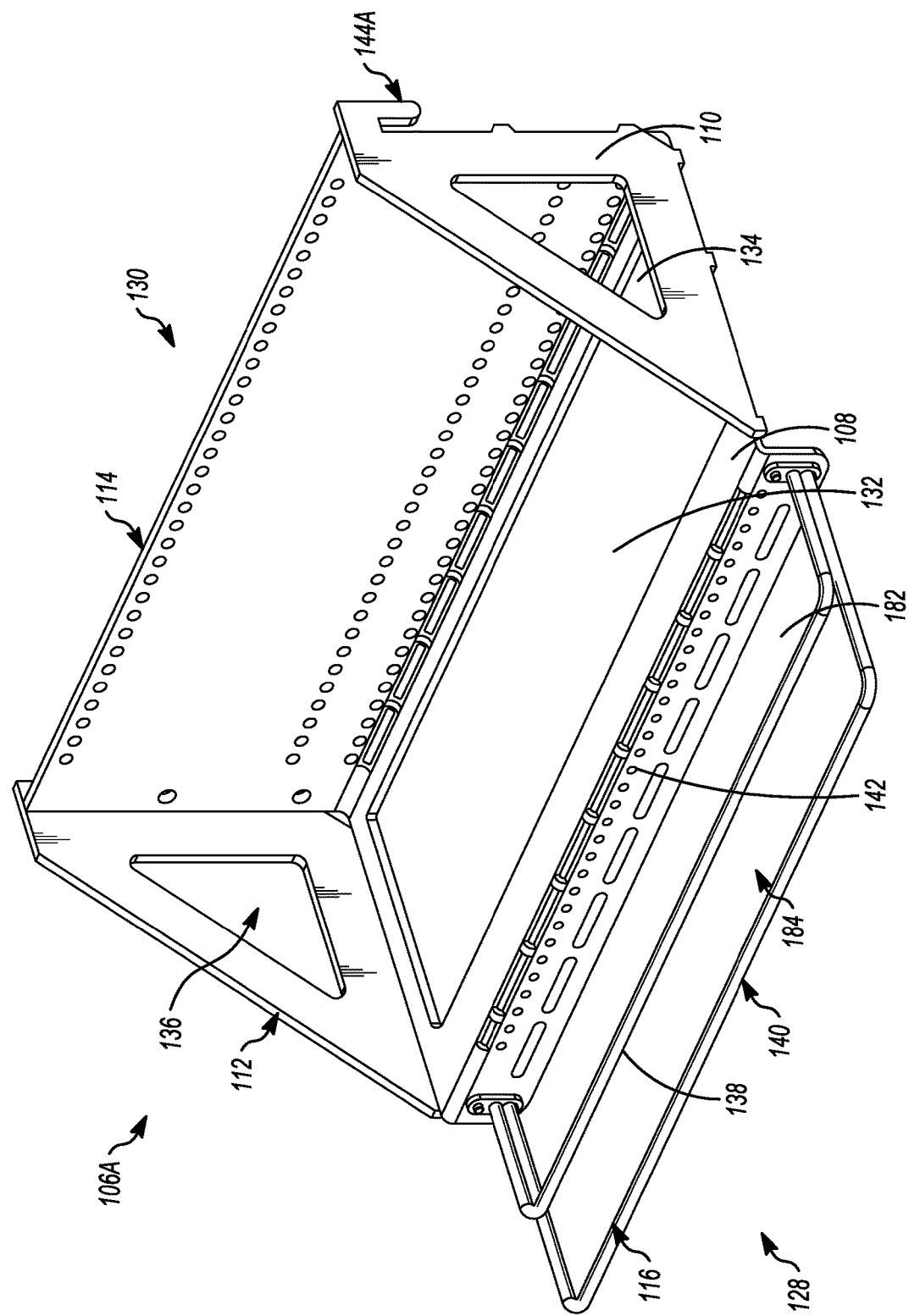
FIG. 2 illustrates a front perspective view of a shelf of the electronics shelving assembly shown in FIG. 1.
Figure 3:
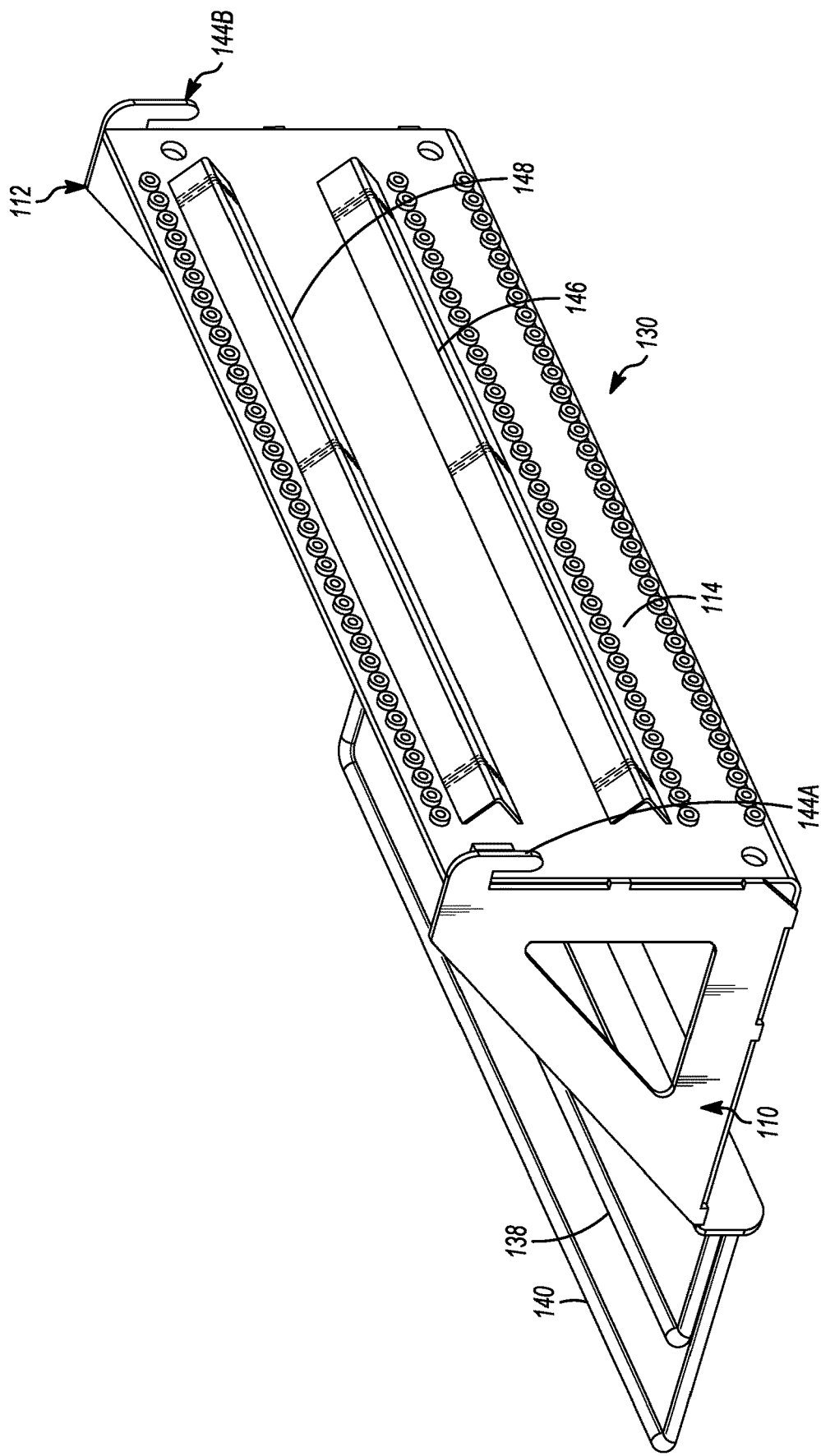
FIG. 3 illustrates a rear perspective view of the shelf shown in FIG. 2.

FIG. 2 illustrates a front perspective view of the shelf 106A of the electronics shelving assembly shown in FIG. 1, and FIG. 3 illustrates a rear perspective view of the shelf shown in FIG. 2. The shelf or shelf assembly includes a horizontal support member 108 that extends between a first vertical coupling member 110 and a second vertical coupling member 112. For example, the first and second vertical coupling members extend in a substantially vertical direction and are substantially parallel with the vertical support members. The horizontal support member extends in a substantially horizontal direction, and is substantially perpendicular with the first and second vertical coupling members. The horizontal support member may be substantially horizontal such that one or more electronic devices or components may be placed on a top surface of the horizontal support member.

The horizontal support member may be coupled with the first and/or second vertical coupling members by welding, mating fastening features (e.g., snaps features, hooks and corresponding openings, or the like), fastening devices (e.g., screws, bolts, nails, straps, or the like), or the like. In one embodiment, the horizontal support member may be manufactured of a metal or metal alloy, and one or both of the vertical coupling members may be manufactured of the same metal or metal alloy as the horizontal support member, or a different metal or different metal alloy. The metal material(s) of the horizontal support member and the vertical coupling members may electrically and conductively couple the horizontal support member with the vertical coupling members. For example, the horizontal support member and the vertical coupling members may be mechanically coupled together and conductively coupled together. Optionally, one of the vertical coupling members (e.g., the first vertical coupling member 110) may be mechanically and conductively coupled with the horizontal support member, and the other vertical coupling member (e.g., the second vertical coupling member 112) may be manufactured of a non-metallic material such that the second vertical coupling member may be mechanically coupled with the horizontal support member but may not be conductively coupled with the horizontal support member. For example, one of the vertical coupling members may be manufactured of a non-metal material such that the non-metal vertical coupling member has a weight or mass that is less than a weight or mass of the metal vertical coupling member. Optionally, one or both of the vertical coupling members, and/or the horizontal support member may be manufactured of a non-metallic material, but may have a metallic coating (e.g., plating, finish, or the like) such that the coating enables the conductive coupling between the members.

The horizontal support member extends between a vertical wall 114 and a front surface 142 of the shelf between the front and rear ends of the electronics shelving assembly. In one or more embodiments, the vertical wall, the front surface, and the horizontal support member may all be formed as a single, homogenous component. For example, the vertical wall, the front surface, and the horizontal support member may be formed as a homogenous single component, rather than a non-homogenous component or a component formed by two or more separate bodies that are then combined with each other. The homogenous component may have the same consistency and/or chemical makeup throughout the entirety or substantially all of the component. The vertical wall, the front surface, and the horizontal support member may be manufactured (e.g., stamped, formed, cast, molded, or the like) of a single piece of metal. Optionally, one or more of the vertical wall, the front surface, and the horizontal support member may be independently formed, and may be operably couple with one or more of the other components (e.g., welding, fastening, or the like).

In the illustrated embodiment of FIG. 3, the shelf includes angled bodies 146, 148 disposed on a rear side of the vertical wall. In the illustrated embodiment, the angled bodies extend a distance along the vertical wall in a substantially horizontal direction, and have a substantially triangular cross-sectional shape. Optionally, the shelf may include one or more angled bodies extending in a substantially vertical direction along the rear surface of the vertical wall. Optionally, the angled bodies may have an alternative cross-sectional shape. For example, the angled bodies may be shaped and/or positioned to define a gap (not shown) between the rear side of the vertical wall and the wall of the vehicle system (not shown). The gap may be an opening to allow air or other fluids to flow to move through the electronics shelving assembly between the vertical walls of each of the shelves and the wall of the vehicle system.

In the illustrated embodiment, the horizontal support member frames an airflow opening 132. The airflow opening may be shaped and/or sized based on a type of electronic device that may be held on the horizontal support member, based on an amount of thermal energy the electronic device is expected to generate, based on other electronic devices expected to be disposed on other shelves of the electronics shelving assembly, or the like. For example, the airflow opening may be positioned, shaped, and sized in order to control thermal energy of the one or more electronic components expected to be disposed within the electronics shelving assembly. For example, the airflow opening may allow air to flow through the horizontal support member.

The first and second vertical coupling members have a substantially triangular shape and each extends between the vertical wall and about the front surface of the shelf in a first lateral direction, and are disposed at opposing ends of the horizontal support member in a second lateral direction. For example, the first and second vertical coupling members are laterally spaced apart from each other. The lateral spacing may be based on the spacing between the first and second vertical support members, based on space requirements in the area of the vehicle in which the electronics shelving assembly is disposed, or the like. In one or more embodiments, the lateral spacing between the first and second vertical coupling members may be based on the size of the one or more electronic devices that may be positioned on the horizontal support member. For example, the vertical coupling members may be laterally spaced to provide a space or gap between neighboring electronic devices disposed on the shelf.

Optionally, one or more of the vertical coupling members may have an alternative shape and/or size. In one embodiment, the shelf may include the first vertical coupling member, but may be devoid the second vertical coupling member. For example, the shelf may be designed to hold a predetermined amount of weight of the electronic devices, and the first vertical coupling member alone may be capable of supporting the predetermined weight requirements. Alternatively, the shelf may include a third vertical coupling member disposed laterally between the first and second vertical coupling members. For example, the shelf may be required to hold a determined amount of weight that exceeds capabilities of the first and second vertical coupling members, and a third vertical coupling member may be required to achieve the weight requirement.

In the illustrated embodiment, each of the first and second vertical coupling members frame respective airflow openings 134, 136, respectively. Like the airflow openings of the horizontal support member, the airflow openings of the vertical coupling members may be designed for thermal management of the electronic devices that may be held on the shelves of the electronics shelving assembly. For example, the airflow openings may allow air to flow between the first and second vertical coupling members.

The shelf includes a wire organizational body 116 that is coupled with the front surface of the shelf. In the illustrated embodiment, the wire organizational body includes a first wire structure 138 and a second wire structure 140 that define annular shapes with the horizontal support member. The first and second wire structures project outwardly from the horizontal support member of the shelf. The first wire structure and the front surface of the shelf define a first wire opening 182, and the first wire structure and the second wire structure define a second wire opening 184. In one or more embodiments, wires of the electronic devices (not shown) may be positioned within one of the first or second wire openings of one or more of the plural shelves of the electronics shelving assembly. For example, the wires of electronic devices positioned on the shelves may be positioned within the first and/or second wire openings of the wire organizational bodies of each shelf.

Figure 4:
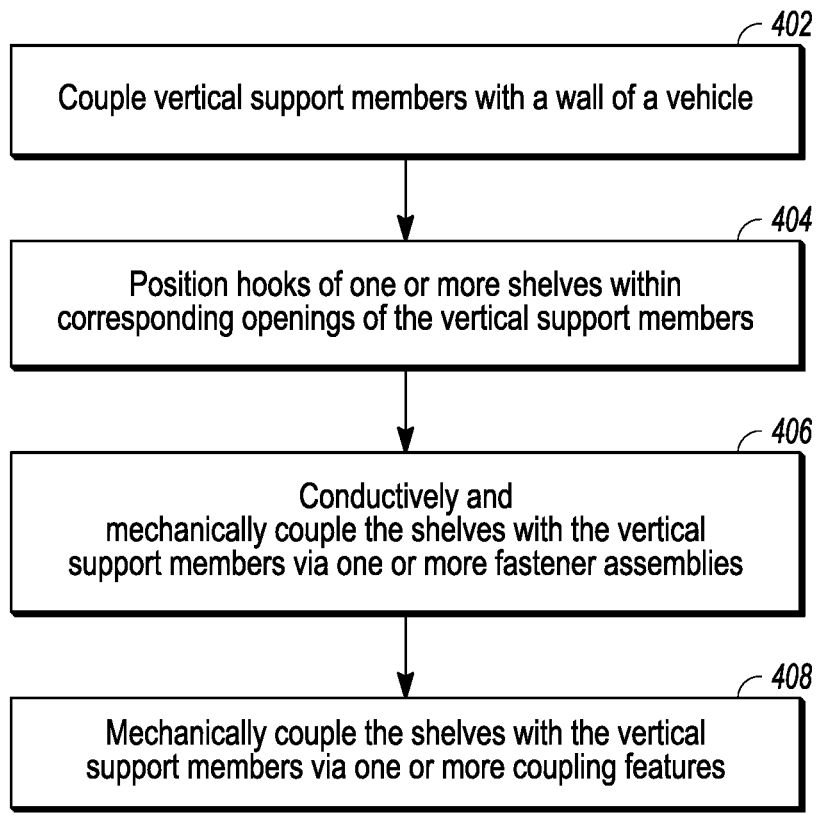
FIG. 4 illustrates a flowchart of one example of a method for assembling an electronics shelving assembly in accordance with one embodiment.
Figure 5:
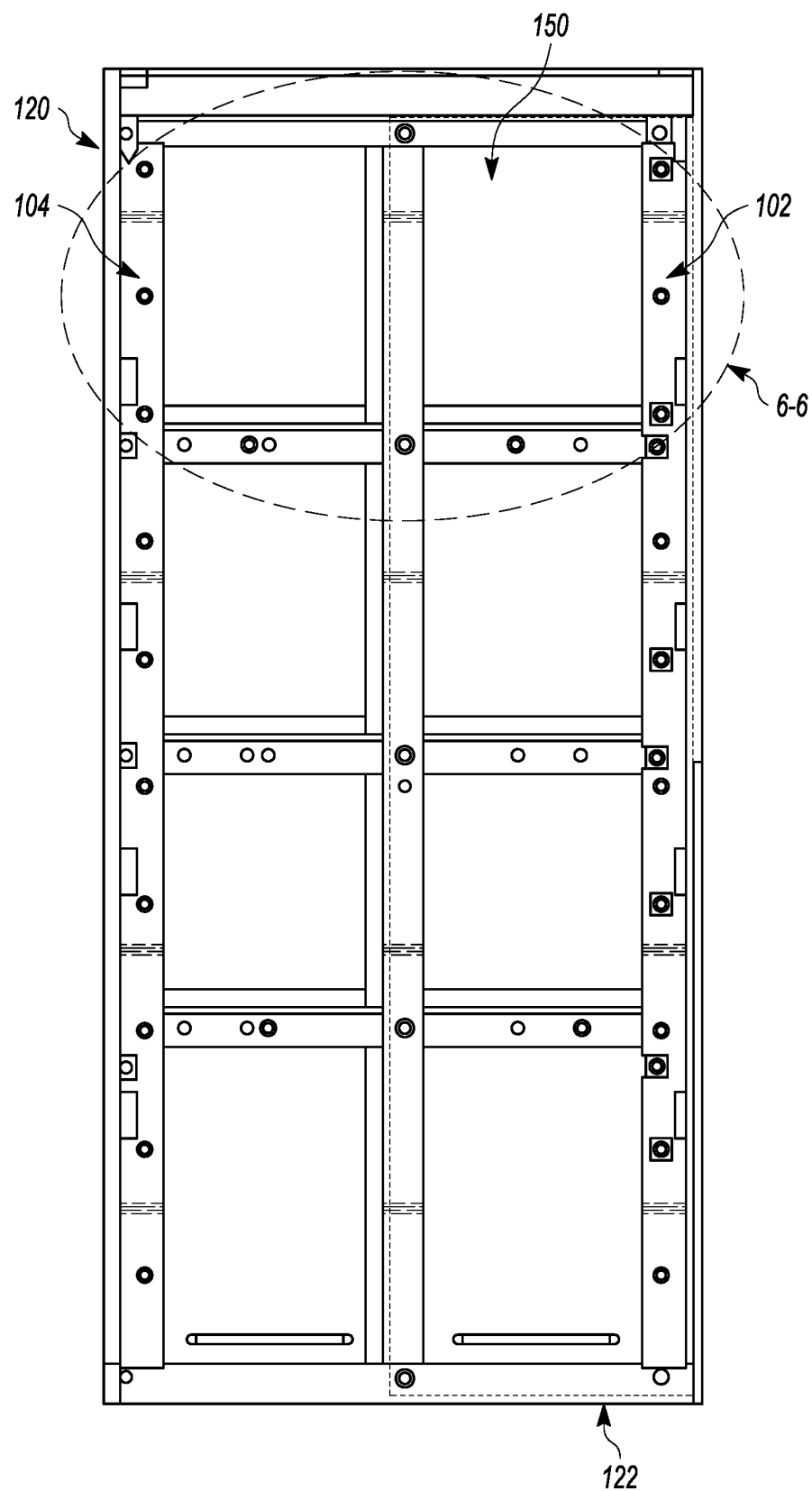
FIG. 5 illustrates a front view of a portion of the electronics shelving assembly shown in FIG. 1.

FIG. 4 illustrates a flowchart of one example of a method of assembling an electronics shelving assembly, such as the electronics shelving assembly shown in FIG. 1. At step 402, plural vertical support members are coupled with a wall of a vehicle. For example, FIG. 5 illustrates a front view of a portion of the electronics shelving assembly shown in FIG. 1. The plural shelves are hidden from view for clarity. In the illustrated embodiment, the first and second vertical support members are coupled with a wall 150 of a vehicle system (not shown). In one embodiment, the wall may be disposed onboard the vehicle system. In another embodiment, the wall may be a separate structure, and may be coupled with a wall or surface of the vehicle. The vertical support members extend between the top end 120 and the bottom end 122 of the electronic shelving assembly. The vertical support members are manufactured of a metal material, or may have a metallic coating or finish, such that welding or coupling the vertical support members with the wall creates a conductive pathway between the vertical support members and the wall of the vehicle.

One or more shelves of the electronics shelving assembly may be coupled (e.g., mechanically and electrically coupled) with the vertical support members subsequent to the vertical support members being coupled with the wall. Returning to FIG. 4, at step 404, hooks of one or more shelves may be positioned within corresponding openings of the vertical support members. As shown in FIG. 3, each of the shelves may include one or more hooks 144A, 144B extending outwardly from a rear side of the first and second vertical coupling members 110, 112 of each of the shelves.

Figure 6:
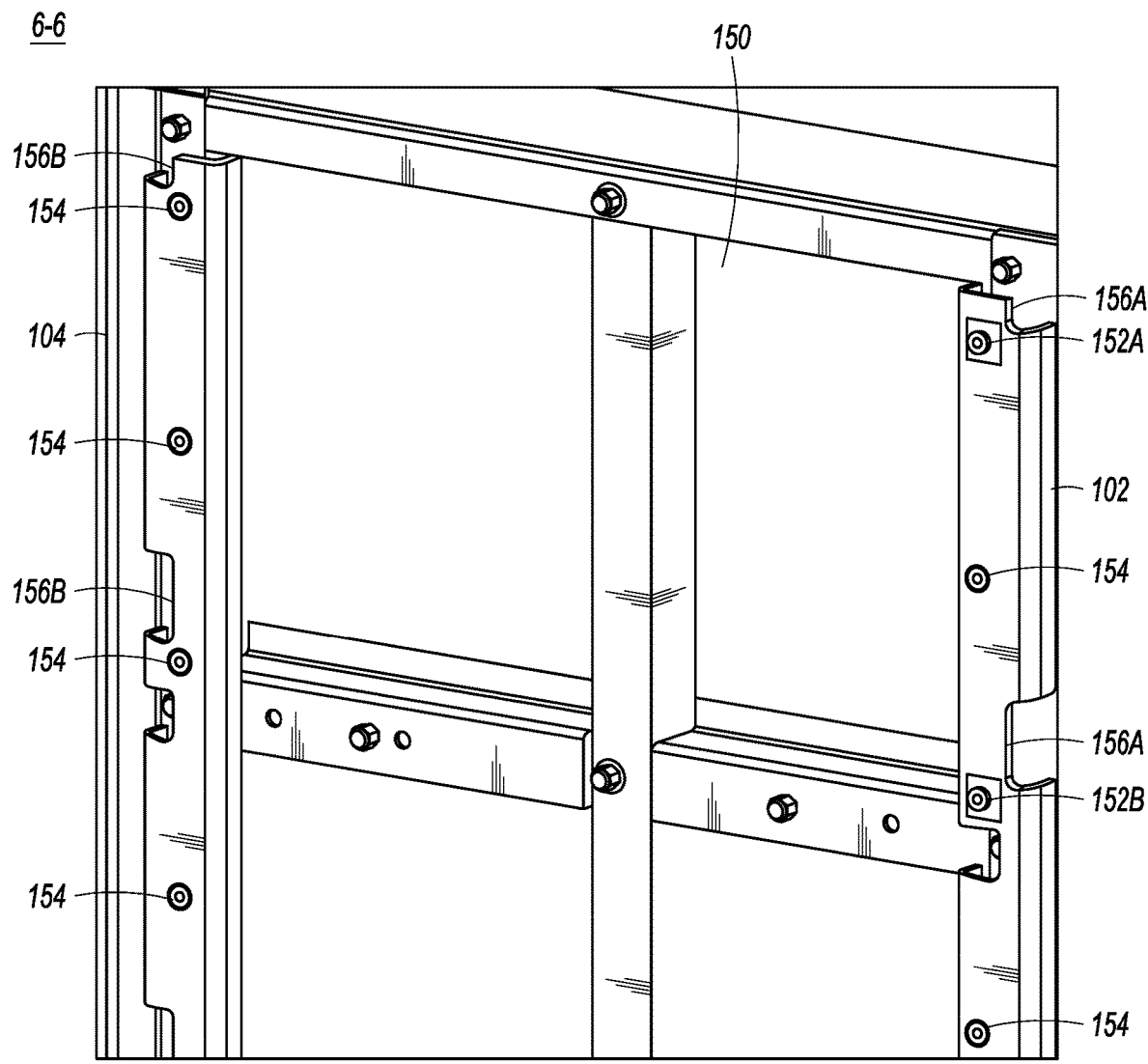
FIG. 6 illustrates a magnified perspective view of the vertical support members shown in FIG. 5.
Figure 7:
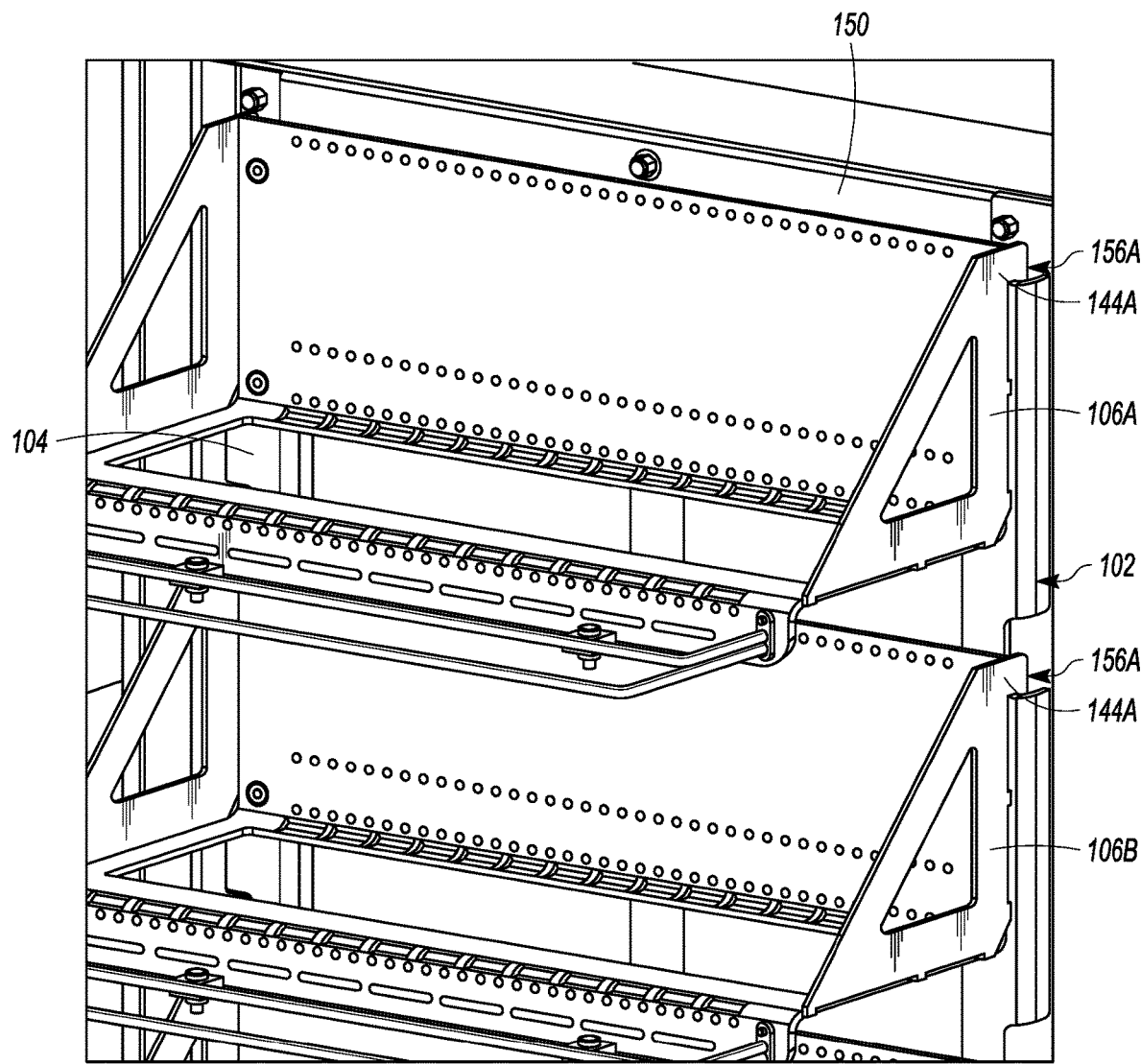
FIG. 7 illustrates a magnified perspective view of the electronics shelving assembly shown in FIG. 5.

FIGS. 6 and 7 illustrate a magnified view of a portion of the electronics shelving assembly shown in FIG. 5. The plural shelves are hidden from view in FIG. 6, and are shown in FIG. 7. As shown in FIGS. 6 and 7, the vertical coupling members may include one or more openings 156A, 156B that correspond with the plural hooks of the vertical coupling members. For example, the hook 144A of the first shelf 106A may be positioned within the opening 156A, and the hook 144B of the first shelf may be positioned within the opening 156B. The hooks and corresponding openings may be shaped to support and maintain the shelves in a position relative to the vertical coupling members while fastener assemblies and other coupling features may be coupled with the vertical support members to mechanically and electrically couple the shelves with the vertical support members. For example, the hooks may hold a position of the shelf to allow an operator or installer of the electronics shelving assembly to complete the fastening of other fastening features without the operator or installer having to manually hold or maintain the position of the shelf during installation.

Figure 8:
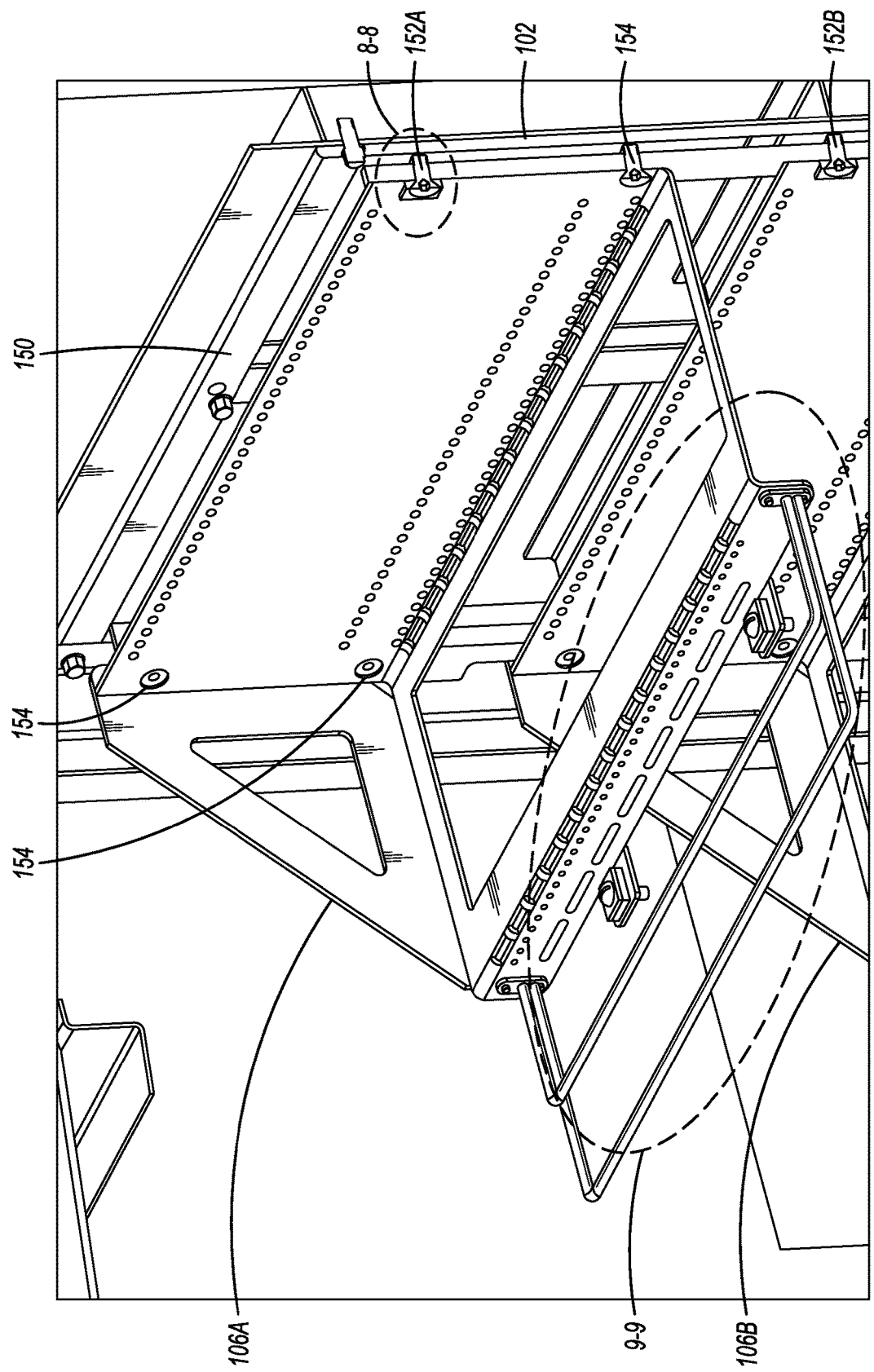
FIG. 8 illustrates a cross-sectional partial perspective view of the electronics shelving assembly shown in FIG. 7.

Returning to FIG. 4, at step 406, the shelves may be conductively and mechanically coupled with the vertical support members via one or more fastener assemblies. FIG. 8 illustrates a cross-sectional partial perspective view of the electronics shelving assembly shown in FIG. 7. In the illustrated embodiment, the first shelf 106A may be conductively and mechanically coupled with the first vertical support member 102 via a first fastener assembly 152A, and the second shelf 106B may be conductively and mechanically coupled with the first vertical member via a second fastener assembly 152B.

Figure 9:
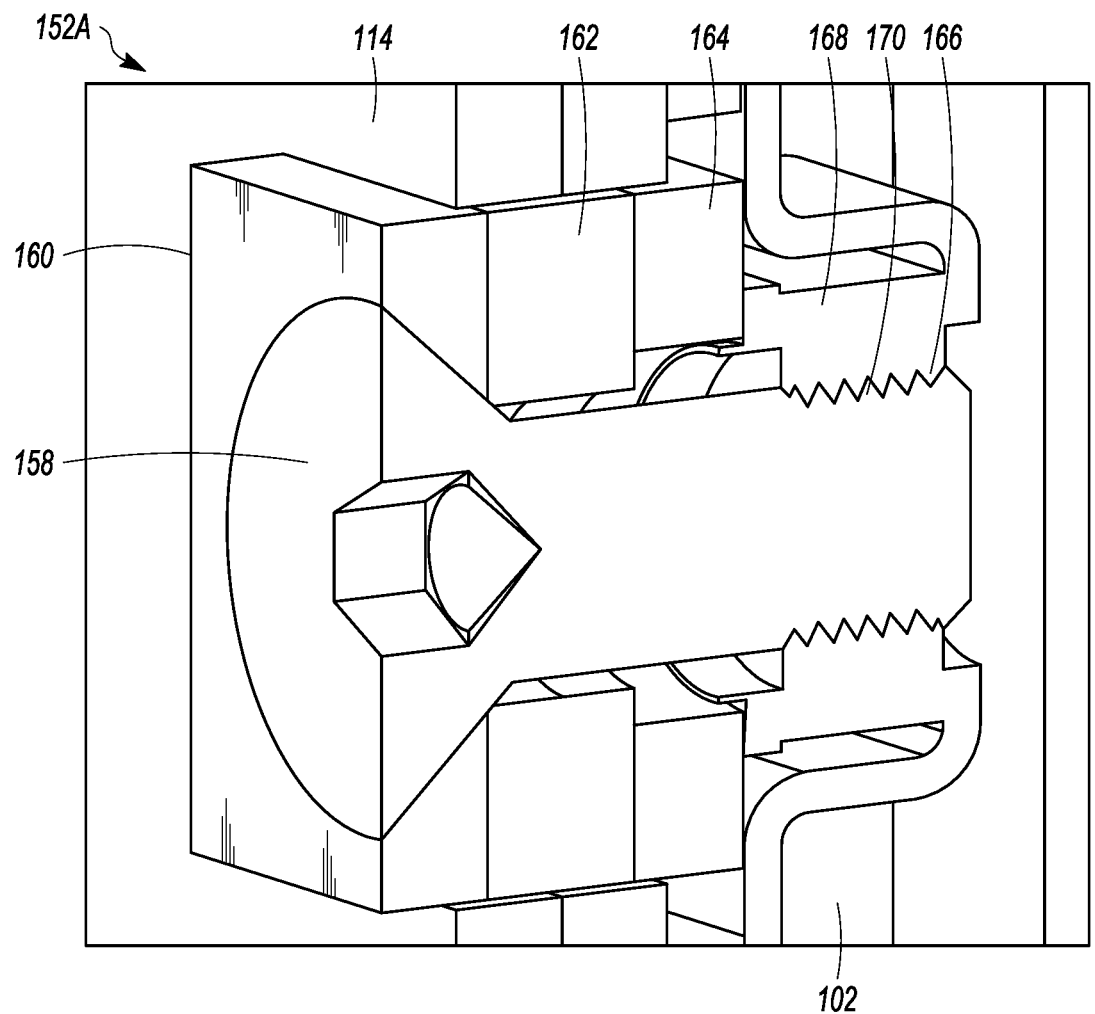
FIG. 9 illustrates a magnified cross-sectional view of a fastener assembly of the electronics shelving assembly shown in FIG. 8.

FIG. 9 illustrates a magnified view of the fastener assembly 152A shown in FIG. 8. The fastener assembly includes plural conductive plates 162, 164 that are sandwiched together and extend around a conductive fastener 158. In the illustrated embodiment, a first conductive plate 162 is disposed within the vertical wall 114 of the shelf, and a second conductive plate 164 is disposed within the first vertical support member 102. The fastener assembly also includes a washer 160 positioned on a front side of the vertical wall, and a threaded receiving connector 168 positioned on a rear side of the first vertical support member. In the illustrated embodiment, the conductive fastener includes threads 166 that mate with threads 170 of the receiving connector. For example, the conductive fastener, coupled with the receiving connector, creates a conductive pathway between the first shelf and an electrical ground (e.g., the wall of the vehicle or another ground block of the vehicle conductively coupled with the wall) via the conductive plates and the first vertical support member. Additionally, the fastener assembly may provide a conductive pathway between the shelf and the first vertical support member across the gap defined by the angled bodies disposed on the rear side of the vertical wall of the shelf (shown in FIG. 3).

In the illustrated embodiment of FIG. 8, the first shelf is conductively and mechanically coupled with the first vertical support member via the a single fastener assembly. In alternative embodiments, two or more fastener assemblies may be used to conductively and mechanically couple the first shelf with the first and/or second vertical support members.

Figure 10:
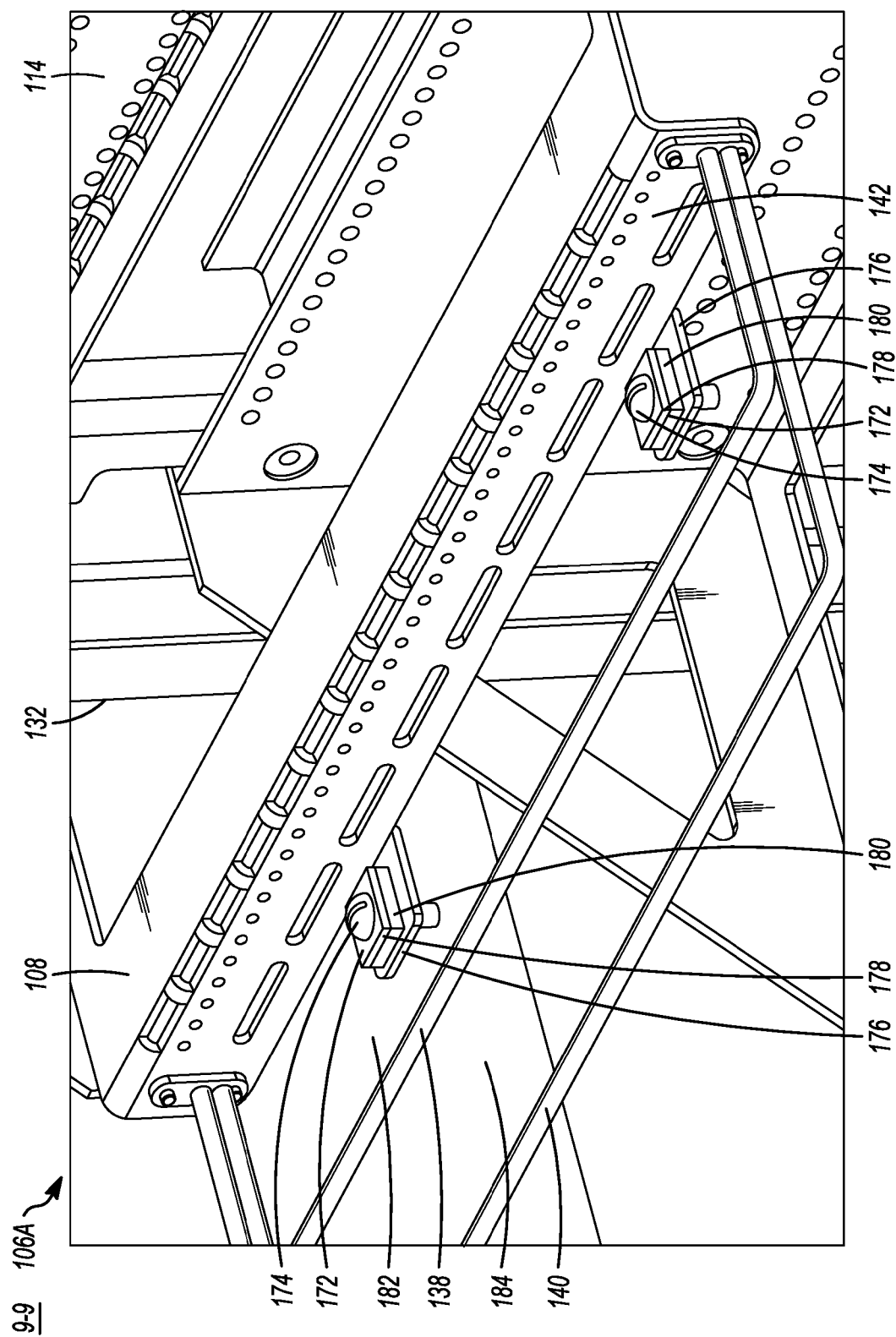
FIG. 10 illustrates a magnified cross-sectional view of a front end of a shelf of the electronics shelving assembly shown in FIG. 8.

In one or more embodiments, one or more of the shelves may include additional fastener assemblies 172 that may be used to conductively couple one or more electronic devices with the electric ground of the vehicle. For example, FIG. 10 illustrates a magnified partial view of the electronics shelving assembly shown in FIG. 8. The first shelf includes tabs 176 that extend outwardly from front surface of the first shelf. Optionally, the first shelf may include less than two or more than two tabs.

In the illustrated embodiment, the tabs include fastener assemblies coupled therein. For example, plural conductive plates 178, 180 sandwiched together and extending around a conductive fastener 174. The fastener assemblies may include a receiving connector (not shown) disposed on a bottom side of the tabs that may be mechanically coupled with the conductive fastener. In one or embodiments, one or more electronic devices or components (not shown) disposed on one of the shelves of the electronics shelving assembly may be conductively coupled with one of the fastener assemblies 172, such as via a conductive grounding strap coupled with a grounding feature of the electronic device and the fastener assembly. Optionally, one or more electronics may be conductively coupled with one of the fastener assemblies 152 used to create a conductive pathway between the shelves and the vertical support members. The electronic devices or components may be conductively coupled with one of the fastener assemblies, 172, 152 of the shelves. Additionally, the shelves may be conductively coupled with one or more of the vertical support members via one of the fastener assemblies 152. Additionally, the vertical support members may be conductively coupled with an electrical ground of the vehicle via the welding or other conductive coupling joint between the wall of the vehicle and the vertical support members. For example, the fastener assemblies, alone with via one or more conductive ground straps, may create conductive pathways between the electronic devices disposed on the electronics shelving assembly and the electrical ground of the vehicle.

Figure 11:
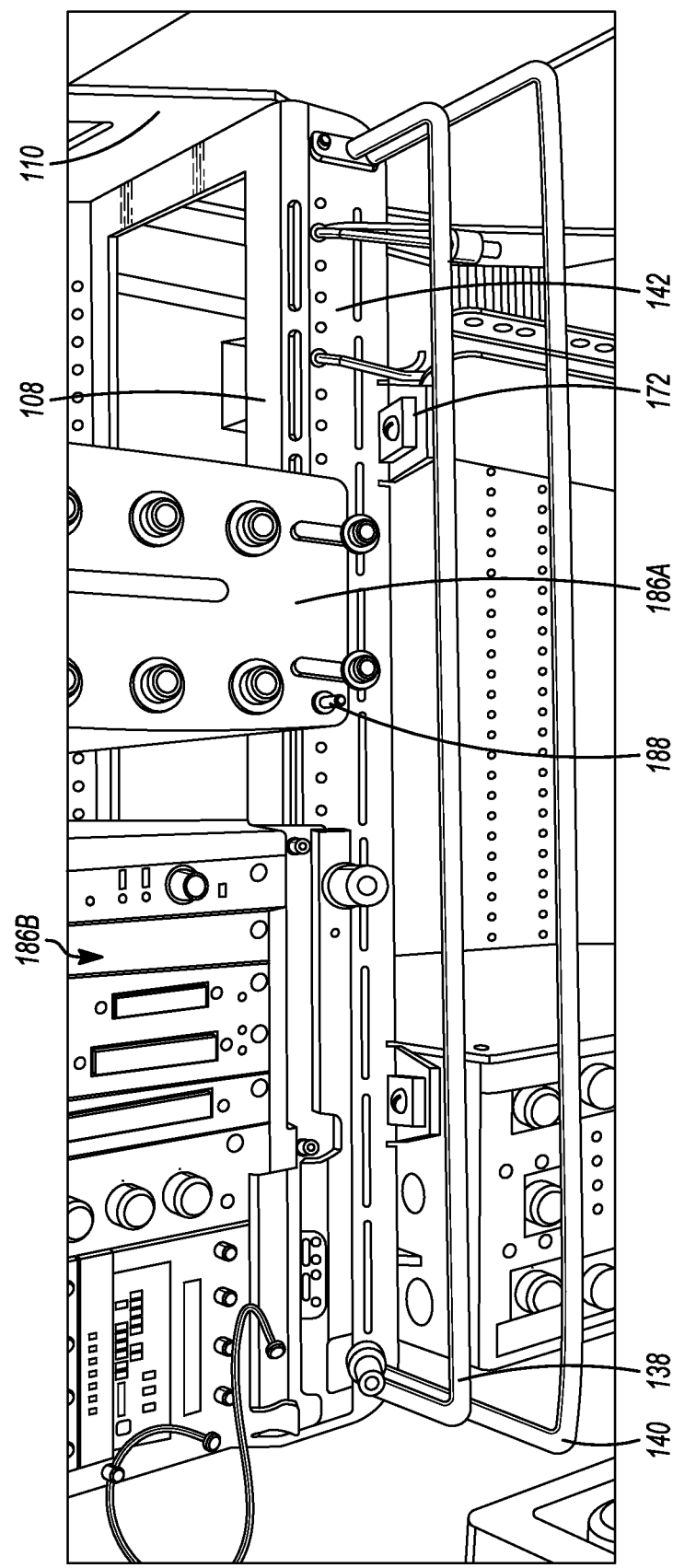
FIG. 11 illustrates a partial front view of an electronics shelving assembly in accordance with one embodiment.

As one example, FIG. 11 illustrates a partial front view of the electronics shelving assembly. In the illustrated embodiment, first and second electronic devices 186A, 186B are disposed on the horizontal support member 108 that extends in a substantially horizontal direction between the first vertical coupling member 110 and the second vertical coupling member (hidden from view in FIG. 11). The electronic devices or components may be conductively coupled with one or more of the fastener assemblies of the shelving assembly. For example, the first electronic device 186A may include a ground feature 188. A first end of a grounding strap (not shown) may be conductively coupled with the ground feature of the first electronic device, and a second end of the grounding strap may be conductively coupled with the fastener assembly 172. Optionally, the first electronic device may be conductively coupled with two or more fastener assemblies. Optionally, the first and second electronic devices may both be conductively coupled with the same fastener assembly. Optionally, the electronic devices disposed on the shelves of the electronics shelving assembly may be electrically ground to the electronics shelving assembly by an alternative and/or additional grounding path.

Returning to FIG. 4, at step 408 the shelves may be mechanically coupled with the vertical support members via one or more coupling features. For example, FIG. 8 illustrates the first shelf coupled with the first and second vertical support members. The first shelf is conductively and mechanically coupled with the first vertical support member via the fastener assembly 152. Additionally, the first shelf is mechanically coupled with the first and second vertical support members via plural coupling features 154. The coupling features may be screws, bolts, or the like. In one embodiment, the coupling features may be conductive coupling features, or alternatively may be non-conductive coupling features.

In one aspect or example, an electronics shelving assembly includes vertical support members that can be coupled with a wall of a vehicle. The vertical support members are conductively coupled with an electrical ground. The electronics shelving assembly also includes shelves, each having a horizontal support member and at least one vertical coupling member coupled with each other. Fastener assemblies mechanically and conductively couple the shelves with the vertical support members. Each of the fastener assemblies includes plural conductive plates sandwiched together and extending around a conductive fastener. The conductive fasteners may be coupled with each of the conductive plates and may be secured to the shelves to create a conductive pathway between the shelves and the electrical ground via the conductive plates and at least one of the vertical support members.

Optionally, at least one of the conductive plates in at least one of the fastener assemblies may be coupled with a conductive grounding strap that conductively couples the at least one of the fastener assemblies with the electrical ground.

Optionally, the at least one vertical coupling member of each of the shelves includes first and second vertical coupling members. The shelves may also include a vertical wall extending between the first and second vertical coupling members with one or more angled bodies that may maintain a gap between the vertical wall and the wall of the vehicle. The fastener assemblies may provide the conductive pathways between the shelves and the vertical support members across the gap.

Optionally, at least one vertical coupling member of each of the shelves may be a first vertical coupling member of the shelf. Each of the shelves may also include a second vertical coupling member laterally spaced apart from the first vertical coupling member. The first and second vertical coupling members may frame respective air flow openings for air to flow between the first and second vertical coupling members.

Optionally, the horizontal support member of each of the shelves may frame an air flow opening for air to flow through the horizontal support member.

Optionally, one or more of the shelves may include a wire organization body outwardly projecting from the one or more horizontal support members of the one or more shelves. The wire organization body of the one or more shelves may define annular shapes with the one or more horizontal support members for positioning wires of electronic components disposed on the horizontal support members.

Optionally, the vertical coupling members of the shelves may include hooks and the vertical support members may include corresponding openings for receiving the hooks of the vertical coupling members.

Optionally, the hooks may be shaped to support and maintain the shelves in position relative to the vertical coupling members while the fastener assemblies are coupled with the vertical coupling members and the vertical support members without additional manual force supporting the shelves.

In one aspect of example, an electronics shelving assembly may include vertical support members that may be coupled with a wall of a vehicle. The vertical support members may be conductively coupled with an electrical ground. The electronics shelving assembly can include shelves, each having a horizontal support member and first and second vertical coupling members coupled with the horizontal support member. The first and second vertical coupling members can frame respective air flow openings for air to flow between the first and second vertical coupling members. Fastener assemblies may mechanically and conductively couple the shelves with the vertical support members.

Optionally, each of the fastener assemblies may include plural conductive plates sandwiched together and extending around a conductive fastener. The conductive fasteners may be coupled with each of the conductive plates and may be secured to the vertical support members to create a conductive pathway between the shelves and the electrical ground via the conductive plates and at least one of the vertical support members.

Optionally, at least one of the conductive plates in at least one of the fastener assemblies may be coupled with a conductive grounding strap that conductively couples the at least one of the fastener assemblies with the electrical ground.

Optionally, the shelves may include vertical walls extending between the first and second vertical coupling members of each of the shelves. The shelves may include one or more angled bodies coupled with the vertical walls and may maintain a gap between the vertical walls and the wall of the vehicle. The fastener assemblies may provide the conductive pathways between the shelves and the vertical support members across the gap.

Optionally, the horizontal support member of each of the shelves may frame a horizontal support air flow opening for air to flow through the horizontal support member.

Optionally, one or more of the shelves may include a wire organization body outwardly projecting from the one or more horizontal support members of the one or more shelves. The wire organization body of the one or more shelves may define annular shapes with the one or more horizontal support members for positioning wires of electronic components disposed on the horizontal support members.

Optionally, the vertical coupling members of the shelves may include hooks and the vertical support members may include corresponding openings for receiving the hooks of the vertical coupling members.

Optionally, the hooks may be shaped to support and maintain the shelves in position relative to the vertical coupling members while the fastener assemblies are coupled with the vertical coupling members and the vertical support members without additional manual force supporting the shelves.

In one aspect or example, an electronics shelving assembly may include support members that may be coupled with a wall of a vehicle. The support members may be conductively coupled with an electrical ground. The electronics shelving assembly can include shelf units, each having a shelf member and first and second coupling members coupled with the shelf member. Fastener assemblies may mechanically couple the first and second coupling members of the shelf units with the support members. Each of the fastener assemblies may include a respective conductive fastener that can be secured to the support members to create a conductive pathway between the shelf units and the electrical ground via the support members.

Optionally, each of the fastener assemblies may include plural conductive plates sandwiched together and extending around the conductive fastener. The conductive fasteners may be coupled with each of the conductive plates and may be secured to the first and second support members to create the conductive pathway between the shelf units and the electrical ground via the conductive plates and at least one of the support members.

Optionally, each of the shelf units may include a shelf unit wall extending between the first and second coupling members with one or more angled bodies that may maintain a gap between the shelf unit wall and the wall of the vehicle. The fastener assemblies may provide the conductive pathways between the shelf units and the support members across the gap.

Optionally, one or more of the shelf units may include a wire organization body outwardly projecting from the one or more shelf members of the one or more shelf units. The wire organization body of the one or more shelf units may define annular shapes with the one or more shelf members for positioning wires of electronic components disposed on the shelf members.

As used herein, an element or step recited in the singular and proceeded with the word "a" or "an" do not exclude the plural of said elements or operations, unless such exclusion is explicitly stated. Furthermore, references to "one embodiment" of the invention do not exclude the existence of additional embodiments that incorporate the recited features. Moreover, unless explicitly stated to the contrary, embodiments "comprising," "comprises," "including," "includes," "having," or "has" an element or a plurality of elements having a particular property may include additional such elements not having that property. In the appended claims, the terms "including" and "in which" are used as the plain-English equivalents of the respective terms "comprising" and "wherein." Moreover, in the following claims, the terms "first," "second," and "third," etc. are used merely as labels, and do not impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function devoid of further structure.

The above description is illustrative, and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein define the parameters of the inventive subject matter, they are exemplary embodiments. Other embodiments will be apparent to one of ordinary skill in the art upon reviewing the above description. The scope of the inventive subject matter should, therefore, be determined with reference to the appended claims, along with the full scope of equivalents to which such claims are entitled.

This written description uses examples to disclose several embodiments of the inventive subject matter, including the best mode, and to enable one of ordinary skill in the art to practice the embodiments of inventive subject matter, including making and using any devices or systems and performing any incorporated methods. The patentable scope of the inventive subject matter is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

What is claimed is:
1. An electronics shelving assembly comprising:
vertical support members configured to be coupled with a wall of a vehicle, the vertical support members configured to be conductively coupled with an electrical ground;

shelves each having a horizontal support member and at least one vertical coupling member each coupled with the horizontal support member; and fastener assemblies configured to mechanically and conductively couple the shelves with the vertical support members, each of the fastener assemblies including plural conductive plates sandwiched together and extending around a conductive fastener, the conductive fasteners coupled with each of the conductive plates and configured to be secured to the shelves to create a conductive pathway between the shelves and the electrical ground via the conductive plates and at least one of the vertical support members.

2. The electronics shelving assembly of claim 1, wherein at least one of the conductive plates in at least one of the fastener assemblies is configured to be coupled with a conductive grounding strap that conductively couples the at least one of the fastener assemblies with the electrical ground.

3. The electronics shelving assembly of claim 1, wherein the at least one vertical coupling member of each of the shelves includes first and second vertical coupling members, the shelves also including a vertical wall extending between the first and second vertical coupling members with one or more angled bodies configured to maintain a gap between the vertical wall and the wall of the vehicle, the fastener assemblies configured to provide the conductive pathways between the shelves and the vertical support members across the gap.

4. The electronics shelving assembly of claim 1, wherein the at least one vertical coupling member of each of the shelves is a first vertical coupling member of the shelf, each of the shelves also including a second vertical coupling member laterally spaced apart from the first vertical coupling member, the first and second vertical coupling members framing respective air flow openings for air to flow between the first and second vertical coupling members.

5. The electronics shelving assembly of claim 1, wherein the horizontal support member of each of the shelves frames an air flow opening for air to flow through the horizontal support member.

6. The electronics shelving assembly of claim 1, wherein one or more of the shelves comprises a wire organization body outwardly projecting from the one or more horizontal support members of the one or more shelves, the wire organization body of the one or more shelves defining annular shapes with the one or more horizontal support members for positioning wires of electronic components disposed on the horizontal support members.

7. The electronics shelving assembly of claim 1, wherein the vertical coupling members of the shelves includes hooks and the vertical support members include corresponding openings for receiving the hooks of the vertical coupling members.

8. The electronics shelving assembly of claim 7, wherein the hooks are shaped to support and maintain the shelves in position relative to the vertical coupling members while the fastener assemblies are coupled with the vertical coupling members and the vertical support members without additional manual force supporting the shelves.

9. An electronics shelving assembly comprising:

vertical support members configured to be coupled with an wall of a vehicle, the vertical support members configured to be conductively coupled with an electrical ground;

shelves each having a horizontal support member and first and second vertical coupling members coupled with the horizontal support member, the first and second vertical coupling members framing respective air flow openings for air to flow between the first and second vertical coupling members; and fastener assemblies configured to mechanically and conductively couple the shelves with the vertical support members.

10. The electronics shelving assembly of claim 9, wherein each of the fastener assemblies includes plural conductive plates sandwiched together and extending around a conductive fastener, the conductive fasteners coupled with each of the conductive plates and configured to be secured to the vertical support members to create a conductive pathway between the shelves and the electrical ground via the conductive plates and at least one of the vertical support members.

11. The electronics shelving assembly of claim 10, wherein at least one of the conductive plates in at least one of the fastener assemblies is configured to be coupled with a conductive grounding strap that conductively couples the at least one of the fastener assemblies with the electrical ground.

12. The electronics shelving assembly of claim 9, wherein the shelves also include vertical walls extending between the first and second vertical coupling members of each of the shelves, the shelves also including one or more angled bodies coupled with the vertical walls and configured to maintain a gap between the vertical walls and the wall of the vehicle, the fastener assemblies configured to provide the conductive pathways between the shelves and the vertical support members across the gap.

13. The electronics shelving assembly of claim 9, wherein the horizontal support member of each of the shelves frames a horizontal support air flow opening for air to flow through the horizontal support member.

14. The electronics shelving assembly of claim 9, wherein one or more of the shelves comprises a wire organization body outwardly projecting from the one or more horizontal support members of the one or more shelves, the wire organization body of the one or more shelves defining annular shapes with the one or more horizontal support members for positioning wires of electronic components disposed on the horizontal support members.

15. The electronics shelving assembly of claim 9, wherein the vertical coupling members of the shelves includes hooks and the vertical support members include corresponding openings for receiving the hooks of the vertical coupling members.

16. The electronics shelving assembly of claim 15, wherein the hooks are shaped to support and maintain the shelves in position relative to the vertical coupling members while the fastener assemblies are coupled with the vertical coupling members and the vertical support members without additional manual force supporting the shelves.

17. An electronics shelving assembly comprising:

support members configured to be coupled with a wall of a vehicle, the support members configured to be conductively coupled with an electrical ground;

shelf units each having a shelf member and first and second coupling members coupled with the shelf member; and fastener assemblies configured to mechanically couple the first and second coupling members of the shelf units with the support members, wherein each of the fastener assemblies includes a respective conductive fastener configured to be secured to the support members to create a conductive pathway between the shelf units and the electrical ground via the support members.

18. The electronics shelving assembly of claim 17, wherein each of the fastener assemblies including plural conductive plates sandwiched together and extending around the conductive fastener, the conductive fasteners coupled with each of the conductive plates and configured to be secured to the first and second support members to create the conductive pathway between the shelf units and the electrical ground via the conductive plates and at least one of the support members.

19. The electronics shelving assembly of claim 17, wherein each of the shelf units also includes a shelf unit wall extending between the first and second coupling members with one or more angled bodies configured to maintain a gap between the shelf unit wall and the wall of the vehicle, the fastener assemblies configured to provide the conductive pathways between the shelf units and the support members across the gap.

20. The electronics shelving assembly of claim 17, wherein one or more of the shelf units comprises a wire organization body outwardly projecting from the one or more shelf members of the one or more shelf units, the wire organization body of the one or more shelf units defining annular shapes with the one or more shelf members for positioning wires of electronic components disposed on the shelf members.

* * * * *